AUTOMATIC GAIN CONTROL GENERATOR FOR RECEIVERS

Filed Nov. 9, 1959

INVENTORS.
JOHN E.R. HARRISON
GEORGE V. LENNON III
JOHANNES VAN SANDWYK by

ATTORNEY.

United States Patent Office 3,060,329

Patented Oct. 23, 1962

3,060,329

AUTOMATIC GAIN CONTROL GENERATOR FOR RECEIVERS

John E. R. Harrison, George V. Lennon III, and Johannes Van Sandwyk, Rochester, N.Y., assignors to General Dynamics Corporation, Rochester, N.Y., a corporation of Delaware Filed Nov. 9, 1959, Ser. No. 851,593

7 Claims. (Cl. 307—88.5)

The present invention relates generally to automatic gain control circuits and is more particularly concerned with a new and improved automatic gain control circuit for use in single sideband receiving equipment for receiving voice transmission.

In the development of single sideband receiving equipment one of the principal problems involved is the provision of an adequate automatic gain control circuit for establishing the proper operating level of the high and/or intermediate frequency stages of the receiver. In conventional AM or FM receivers, automatic gain control is generally effected by using the signal strength of the carrier wave to develop a D.C. signal for controlling the bias on one or more of the receiver stages. In single sideband systems, however, no carrier wave is present and, as a consequence, the automatic gain control voltage must be derived from some other characteristic of the received signal. Because of the irregularities in speech mannerisms, the ideal automatic gain control circuit would develop a control signal which has a level determined by the peak of the received signal and which maintains this level for a predetermined period of time. More particularly, an AGC circuit which develops a control signal having a level changing rapidly in response to variations in the received signal is unsatisfactory because it distorts the audio message.

It is, therefore, the primary object of the present invention to provide an automatic gain control circuit possessing operating characteristics closely approximating the ideal circuit described above.

The invention has for a further object the provision of an automatic gain control circuit of the character indicated employing transistors in order to realize all of the well known advantages of these devices.

Another object of the invention is to provide a circuit for developing an automatic gain control signal which has a level established by the peak of the received signal, which maintains this level for a predetermined period and which diminishes at the expiration of the predetermined period.

It is also an object of the present invention to provide a new and improved circuit for maintaining a desired signal level for a predetermined delay period.

A further object of the invention is to provide a delay circuit of the type indicated wherein capacitors are charged to different levels and wherein the highly charged capacitor is allowed to discharge through a low resistance circuit while the charge on the low charged capacitor remains constant until the highly charged capacitor discharges to the level of the low charged capacitor, whereupon a switching circuit discharges both capacitors through the low resistance circuit.

The invention has for a further object the provision of a circuit of the type just described wherein an AGC signal is developed by charging both capacitors to levels proportional to the peak of the received signal.

In accordance with the present invention, the foregoing and other objects are achieved by providing an automatic gain control circuit including a pair of peak detectors excited by signals of different level but derived from the same received signal. Capacitors in the peak detector circuits are charged to levels respectively corresponding to the amplitudes of the input signals. When the input signals cease the charge on the lower level capacitor remains substantially constant but the higher level capacitor discharges through a resistance. When the higher level signal discharges to a point slightly below the level of the lower signal, a switching transistor is rendered effective to make the lower charged capacitor discharge at the same rate as the initially higher charged capacitor. Thus, following disappearance of the input signals, the lower level signal remains at the constant level for a predetermined period of time the length of which is, of course, controlled by the time constant circuit containing the initially higher charged capacitor. This lower level signal is, therefore, of the ideal form for use as in automatic gain control.

The invention, both as to its organization and manner of operation, together with further objects and advantages thereof, will best be understood by reference to the following detailed description taken in conjunction with the accompanying drawing wherein.

Figure 1:
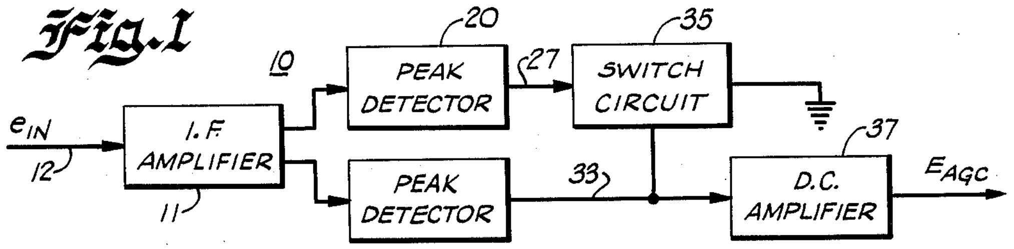
FIG. 1 is a block diagram illustrating an automatic gain control circuit characterized by the features of the present invention.
Figure 2:
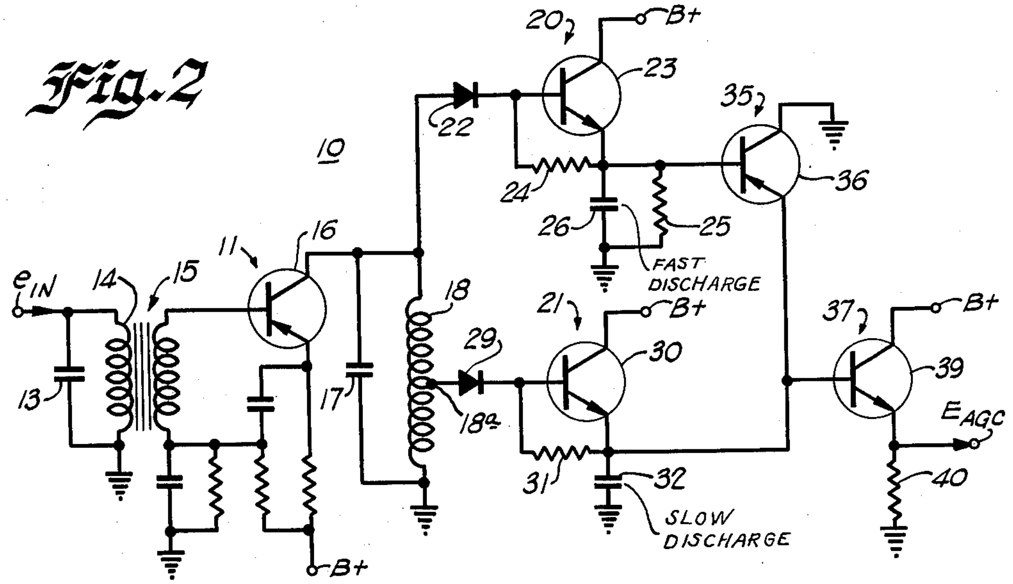
FIG. 2 is a schematic diagram of the circuits shown in block form in FIG. 1.

Referring now to the drawing and first to FIGS. 1 and 2, the automatic gain control circuit of the present invention is there indicated generally by the reference numeral 10. While the input signal to the circuit may be derived from a number of points in the receiver it is shown as emanating from a typical intermediate frequency amplifier 11. The latter amplifier is excited at its input by an IF signal $e_{in}$ which takes the form of the wave 12 shown in FIG. 3. As is illustrated in FIG. 2, the input signal is applied across a tuned circuit comprising a capacitor 13 connected in shunt with the primary winding 14 of a conventional IF transformer 15. The secondary winding of the latter transformer is connected to supply excitation signals across the base to emitter circuit of a transistor 16 which is illustrated as being a PNP junction transistor. The IF amplifier 11, which includes the transistor 16, operates in conventional manner and, hence, will not be described in detail.

Figure 3:
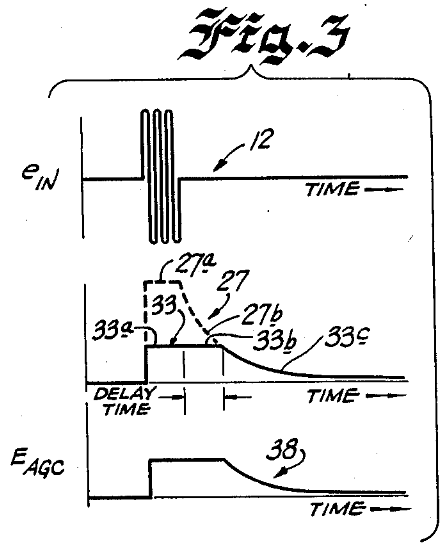
FIG. 3 shows a series of waveforms which will be helpful in understanding the operation of the circuit shown in FIGS. 1 and 2.

The output signals from the collector of the transistor 16 are supplied to a parallel resonant tank circuit including a condenser 17 and a tapped output coil 18. The latter tank circuit is, of course, tuned to resonate at the IF frequency and the signals developed thereacross are supplied to a pair of peak detector circuits 20 and 21. More specifically, the full output signal appearing across the coil 18 is applied through a clipping diode 22 to the base to emitter circuit of a transistor 23 in the peak detector circuit 20. This signal is developed across a circuit including a resistor 25 and a condenser 26 connected in parallel with each other and in series with a resistor 24 bridging the base and the emitter of the transistor 23, which is illustrated as being of the NPN junction type. The condenser 26 is charged to a value corresponding to the peak amplitude of the signal supplied through the diode 22 and this charge is maintained as long as the input signal remains at the peak level. The signal appearing across the capacitor 26 is indicated in FIG. 3 by the waveform 27 shown in broken lines with the flat portion 27a of this waveform representing the period during which the input signal is at peak level to maintain the charge across the condenser. As soon as the input signal ceases or falls below the peak level the condenser 26 begins to discharge through the resistor 25 which is relatively small so that the time constant of the circuit is short. The discharge of the condenser 26 is indicated by the exponentially decreasing portion 27*b* of the wave 27 shown in FIG. 3.

The peak detector 21 is excited by only a portion of the signal appearing across the output coil 18. This portion is applied from a tap 18*a* on the output coil through a half wave rectifying diode 29 to a transistor 30 in the peak detector circuit 21. The signal passed by the diode 29 is developed across a resistor 31 connected between the base and emitter of the transistor 30 and a condenser 32 connected from the emitter to ground. The condenser 32 is thus charged to a value corresponding to the peak of the signal portion passed by the diode 29 and this charge is maintained throughout the presence of the input signal. It was found that excellent results are obtained when the tap 18*a* supplies to the detector 21 about one-third of the signal supplied to the detector 20. Under these conditions, the capacitor 32 is charged to a level of only one-third that of capacitor 26. Even when the input signal 12 is no longer present, the charge on the capacitor 32 remains at substantially the peak level because the discharge path for this capacitor includes only leakage resistance and, hence, the discharge circuit time constant is very long. The voltage appearing across the capacitor 32 is represented by the waveform 33 shown in solid lines in FIG. 3 with the flat portion 33*a* indicating the period during which the input signal is present and the flat portion 33*b* representing the period immediately following the input signal when the charge on the capacitor 32 remains substantially constant. It will also be observed that the amplitude of the flat portion 33*a* is only one-third that of the flat portion 27*a*.

The signals appearing across the two capacitors 26 and 32 are applied to a switching circuit 35 which functions at a preselected time to connect the capacitor 32 to a low resistance discharge circuit. More specifically, the signal appearing across the capacitor 26 is supplied to the base of a transistor 36 in the switching circuit 35. The latter transistor is illustrated as being of the PNP junction type and has its emitter supplied with the direct current voltage signals from the emitter of transistor 30 which appear across the capacitor 32. When the signal across the capacitor 26 discharges to a point slightly below the level of the charge across the capacitor 32, i.e., when the sloping portion 27*b* of the waveform 27 falls slightly below the level 33*b* of the waveform 33, the transistor 36 conducts thus providing a low resistance discharge path for the condenser 32 to ground, at a rate controlled by the time constant of resistor 25 and condenser 26, whereupon the signal across the capacitor 32 decreases exponentially along the same path as the voltage across condenser 26, an occurrence which is indicated by the portion 33*c* of the wave 33 shown in FIG. 3.

The signal at the emitter of the transistor 30 is applied through a D.C. amplifier 37 to develop an AGC control signal having the apearance of the wave 38 shown in FIG. 3. More particularly, the signal appearing across the condenser 32 is applied to the base of a transistor 39 illustrated as NPN junction type. This signal is amplified and the output signal 38 is developed across a resistor 40 connected between the emitter of the transistor 39 and ground. The output signal is, of course, used in conventional manner to control the gain of one or more stages of the receiver.

In view of the foregoing description it will be observed that the circuit 10 of the present invention develops an AGC output signal which is proportional in amplitude to a preceding peak signal and which is sustained for a predetermined period of time after the input signal has disappeared. The length of this predetermined period is a function of the time constant of the peak detector circuit 20 and of the relative magnitudes of the charges on the capacitors 26 and 32 when the input signal is present.

Figure 4:
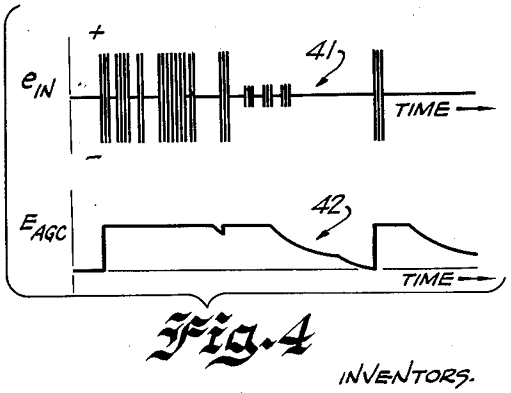
FIG. 4 shows a portion of a typical received message and the gain control signal developed in response to this message portion by the circuit shown in FIGS. 1 and 2.

The AGC voltage developed in response to a typical speech modulated single sideband signal is indicated in FIG. 4 where the IF signal is represented by the wave 41 and the AGC voltage for the RF or IF amplifiers of the receiver is represented by the wave 42. The operation of the circuit 10 to develop the AGC signal 42 is believed to be obvious from the prior description.

While particular embodiments of the invention have been shown, it will be understood, of course, that the invention is not limited thereto since many modifications will occur to those skilled in the art and it is, therefore, contemplated by the appended claims to cover any such modifications as fall within the true spirit and scope of the invention.

What is claimed as new and desired to be secured by Letters Patents of the United States is:

1. In an automatic gain control circuit for use in suppressed-carrier amplifying equipment to develop a unidirectional gain control voltage in response to intermittent bursts of side-band signals, means responsive to the signal bursts for developing a unidirectional gain control voltage having a level proportional to the peak of the signals, means for continuously applying said unidirectional voltage to the gain control circuits of said equipment, means for maintaining said unidirectional voltage at an attained level for an indefinitely long interval of time following the expiration of each received signal burst, and switch means for rapidly discharging said voltage a predetermined interval of time after the expiration of each burst of the received signal.

2. The combination for controlling the gain in a signal amplifier comprising a detector with a first integrating means having a relatively long time constant, said detector with integrating means being coupled to said amplifier and responsive to signal amplitude for generating a direct current voltage proportional to signal amplitude, means for continuously applying said direct current voltage to the gain control elements of said amplifier, a switch circuit coupled across said integrating means for abruptly shortening said relatively long time constant, and means including a second integrating means having a relatively short time constant and being responsive to cessation of amplifier signals for operating said switch circuit a measurable interval of time after cessation of signals.

3. A fast attack-slow release automatic gain control circuit for use in amplifier equipment to develop a unidirectional control voltage in response to received intermittent signal bursts, said circuit comprising means responsive to the received signal for developing a unidirectional voltage having a level proportional to the amplitude of the received signal, and a condenser for storing said unidirectional voltage at said level, an amplifier connected in the charging circuit of said condenser and responsive to said unidirectional voltage for accelerating the charging rate of said condenser upon receipt of each signal burst, means for continuously applying the condenser voltage to the gain control circuits of said amplifier equipment, said condenser having a relatively high shunt resistance and a relatively long time constant, controllable variable resistance means connected across said condenser for accelerating the discharge of said condenser at a controlled rate, and means responsive to said received signal for operating said variable resistance means a predetermined interval of time after the expiration of each signal burst.

4. In the gain control circuit defined in claim 3, said means for accelerating discharge of said condenser comprising a transistor with a control electrode and an interelectrode path having a variable resistance controllable by the potential of said control electrode, said interelectrode path being connected across said condenser, and means responsive to said received signal for changing said potential of said control electrode.

5. An automatic gain control system in a radio receiver, said system comprising a storage condenser with high shunt resistance for relatively long time constant operation, a first signal source of relatively low voltage coupled directly to said radio receiver signal channel, a rectifier coupled between said first source and said storage condenser for charging said condenser to a steady direct current voltage proportional to said relatively low signal voltage, and means for continuously applying the storage condenser voltage to the gain control circuits of said receiver; and means for discharging said storage condenser a predetermined time after each cessation of said signal voltage, said means comprising a second condenser, said second condenser having a relatively low shunt resistance for relatively short time constant operation, a second signal source coupled directly to said radio receiver signal channel, the voltage of said second source being relatively high compared to the voltage of said first source, a rectifier coupled between said second source and said second condenser for charging said second condenser to a relatively high steady direct current voltage; a solid-state switch-type relay, said relay having a controlling circuit and a controlled circuit, said controlled circuit being connected across said storage condenser and said controlling circuit being responsive to a predetermined voltage across said second condenser for selectively shunting, and rapidly discharging, said storage condenser.

6. In the automatic gain control system defined in claim 5, said relay comprising a transistor with three electrodes, said controlled circuit including the current path between two of said electrodes and said controlling circuit including the third electrode.

7. In the automatic gain control system defined in claim 5, said relay comprising a transistor with base, collector, and emitter electrodes, said controlled circuit including said emitter and collector electrodes, and said controlling circuit including said base electrode.

References Cited in the file of this patent

FOREIGN PATENTS 807,780 Great Britain ___________ Jan. 21, 1959